(12) United States Patent  
Kruip

(10) Patent No.: US 8,264,225 B2  
(45) Date of Patent: Sep. 11, 2012

(54) MASS DAMPED BORE TUBE FOR IMAGING APPARATUS

(75) Inventor: Marcel Jan Marie Kruip, Oxford (GB)

(73) Assignee: Siemens PLC, Frimley, Camberley (GB)

( * ) Notice: Subject to any disclaimer, the term of this patent is extended or adjusted under 35 U.S.C. 154(b) by 0 days.

(21) Appl. No.: 13/188,590

(22) Filed: Jul. 22, 2011

(65) Prior Publication Data

US 2012/0019249 A1  Jan. 26, 2012

(30) Foreign Application Priority Data

Jul. 23, 2010 (GB) .................................. 1012357.8

(51) Int. Cl.  
*G01V 3/00* (2006.01)

(52) U.S. Cl. .................. 324/318; 324/321; 600/415

(58) Field of Classification Search .................. 324/318, 324/319, 321; 600/407, 411, 415  
See application file for complete search history.

(56) References Cited

U.S. PATENT DOCUMENTS

| | | | |
|---|---|---|---|
| 4,924,184 A | 5/1990 | Yoda | |
| 5,280,259 A | 1/1994 | Idemaru et al. | |
| 5,309,105 A * | 5/1994 | Sato et al. | 324/318 |
| 5,617,026 A | 4/1997 | Yoshino et al. | |
| 5,841,279 A | 11/1998 | Hayashi et al. | |
| 6,232,548 B1 | 5/2001 | Eberler | |
| 6,294,972 B1 * | 9/2001 | Jesmanowicz et al. | 335/301 |
| 8,026,721 B2 * | 9/2011 | Sodickson et al. | 324/318 |
| 8,148,987 B2 * | 4/2012 | Kruip | 324/318 |
| 2001/0027264 A1 | 10/2001 | Gebhardt | |
| 2005/0030027 A1 | 2/2005 | Dietz | |
| 2005/0030030 A1 | 2/2005 | Kolbeck et al. | |
| 2008/0191698 A1 | 8/2008 | Nogami | |

FOREIGN PATENT DOCUMENTS

| | | |
|---|---|---|
| EP | 0479278 A1 | 4/1992 |
| GB | 2297166 A | 7/1996 |

* cited by examiner

*Primary Examiner* — Louis Arana  
(74) *Attorney, Agent, or Firm* — Schiff Hardin LLP

(57) ABSTRACT

A bore tube for use in an imaging apparatus has a first tube and a second tube. The first tube is a complete cylinder of electrically conductive material; and the second tube is segmented into separate elements, each separately attached to the first tube.

22 Claims, 4 Drawing Sheets

MASS DAMPED BORE TUBE FOR IMAGING APPARATUS

BACKGROUND OF THE INVENTION

1. Field of the Invention

The present invention relates to cylindrical magnet systems as used in imaging systems such as MRI (Magnetic Resonance Imaging) systems.

2. Description of the Prior Art

FIG. 1 shows a radial cross-section through a typical magnet system for use in an imaging system. A cylindrical magnet 10, typically comprising superconducting coils mounted on a former or other mechanical support structure, is positioned within a cryostat, comprising a cryogen vessel 12 containing a quantity of liquid cryogen 15, for example helium, which holds the superconducting magnet at a temperature below its transition temperature. The cryogen vessel 12 is itself cylindrical, having an outer cylindrical wall 12a, an inner cylindrical bore tube 12b, and substantially planar annular end caps (not visible in FIG. 1). An outer vacuum container (OVC) 14 surrounds the cryogen vessel. It also is itself cylindrical, having an outer cylindrical wall 14a, an inner cylindrical bore tube 14b, and substantially planar annular end caps (not visible in FIG. 1). A hard vacuum is provided in the volume between the OVC 12 and the cryogen vessel 14, providing effective thermal insulation. A thermal radiation shield 16 is placed in the evacuated volume. This is typically not a fully closed vessel, but is essentially cylindrical, having an outer cylindrical wall 16a, an inner cylindrical bore tube 16b, and substantially planar annular end caps (not visible in FIG. 1). The thermal radiation shield 16 serves to intercept radiated heat from the OVC 14 before it reaches the cryogen vessel 12. The thermal radiation shield 16 is cooled, for example by an active cryogenic refrigerator 17, or by escaping cryogen vapor.

In alternative arrangements, the magnet is not housed within a cryogen vessel, but is cooled in some other way: either by a low cryogen inventory arrangement such as a cooling loop, or a 'dry' arrangement in which a cryogenic refrigerator is thermally linked to the magnet. There is no cryogen reservoir to absorb heat generated by ohmic heating of various conductive components by eddy currents.

The OVC bore tube 14b must be mechanically strong and vacuum tight, to withstand vacuum loading both radially and axially. Conventionally, it made of stainless steel. The cryogen vessel bore tube 12b, if any, must be strong and capable of withstanding the pressure of cryogen gas within the cryogen vessel. Typically, this is also of stainless steel. The bore tube 16b of the thermal radiation shield 16 must be impervious to infra-red radiation, and must be thermally and electrically conductive to provide electromagnetic shielding of the magnet from the gradient coils. It is preferably lightweight. It is typically made of aluminum.

The present invention may be applied in all such cases.

In order to provide an imaging capability, a set of gradient coils (not shown) are provided within the bore of the superconducting magnet. These are usually arranged as a hollow cylindrical, resin-impregnated block, containing coils which generate orthogonal magnetic field gradients in three dimensions.

During an imaging procedure, the gradient coils generate rapidly oscillating magnetic fields, for example at a frequency of about 1500 Hz. Stray fields from the gradient coils generate eddy currents in metal parts of the cryostat, in particular in metal bore tubes 14b, 16b, 12b of OVC, thermal shield and cryogen vessel, and also in the structure of the magnet 10. The eddy currents produced in the material of the OVC 14 will help to shield the thermal shield 16 and cryogenically cooled components such as cryogen vessel bore tube 12b, magnet coils and magnet former 10 from stray fields from the gradient coils. However, because of the constant background magnetic field produced by the magnet, those eddy currents produce Lorentz forces, acting radially and resulting in mechanical vibrations in the bore tube of the OVC.

These mechanical vibrations, in the constant background magnetic field of the magnet 10, will in turn cause secondary eddy currents in adjacent conductive materials, such as the bore tube 16b of the thermal radiation shield, or the bore tube 12b of a cryogen vessel. The secondary eddy currents will of course generate magnetic fields, known as secondary magnetic fields. These will interfere with imaging, and produce mechanical vibrations and secondary stray fields, which can be much larger than the stray fields produced by the gradient coils, in that region. The secondary stray fields also induce tertiary eddy currents in nearby conductive surfaces. These tertiary eddy currents will, in turn, generate tertiary magnetic fields, and so on.

A particular difficulty arises when, as is typical, the frequency of oscillation of the gradient magnetic fields is close to the resonant frequency of the bore tubes. It is known that a number of concentric tubes of similar diameters, such as the bore tubes of the OVC, thermal radiation shield and cryogen vessel of a typical MRI system, have similar effective resonant frequencies.

The mechanical vibrations will be particularly strong when a resonant vibration frequency of a bore tube corresponds to the frequency of oscillation of the stray field. If the resonant frequencies of the OVC, thermal shield, cryogen vessel if any, and magnet components are close together, as is the case in present magnets, the bore tubes behave as a chain of closely coupled oscillators, and resonance bands will occur.

The oscillations may also interfere with the imaging process, causing detriment to the resulting images.

The resulting oscillations cause acoustic noise which is most unpleasant for a patient in the bore, as well as interfering with imaging and causing heating of cooled components such as the thermal radiation shield and cryogen vessel, if any.

The eddy currents induced in the cryogenically cooled components of the magnet constitute an ohmic heat load on the cryogenic cooling system, leading to an increased consumption of liquid cryogen where used, or an increased heat load on the cryogenic refrigerator. In dry magnets—those which are not cooled by a liquid cryogen—the increased heat load can result in a temperature rise of the coils, which can result in a quench.

In U.S. Pat. No. 6,707,302, suggestions are made to adjust the resonant frequencies of bore tubes, by a number of alternative arrangements: choice of differing materials, such as aluminum or copper; corrugating the bore tubes; or slitting the bore tubes. Among these ideas, the choice of material has only a limited scope for changing resonant frequencies; corrugating of bore tubes consumes significant radial space within the magnet, leading to a more cramped patient bore, or the need to make larger diameter coils, which in turn significantly increases cost. Corrugations also introduce a high anisotropy: the resultant bore tube will be stiff in one direction, but flexible in a perpendicular direction. Slitting the bore tube worsens the shielding effect of the thermal radiation shield, and is not applicable to OVC or cryogen vessel bore tubes.

SUMMARY OF THE INVENTION

This problem may be addressed by increasing the mass per unit area of the bore tubes, without increasing the stiffness of the bore tubes. This will result in a reduction in the resonant frequency of the bore tube, taking it away from the frequencies of oscillation of the gradient magnetic fields, which may typically be in the region of 1500 Hz The present invention accordingly aims to reduce the oscillation of bore tubes subjected to oscillating gradient magnetic fields, by adjusting their resonant frequency. The present invention also provides bore tubes of increased mass, which reduces the amplitude of mechanical oscillations, reducing noise and reducing the propagation of secondary and tertiary magnetic fields.

DESCRIPTION OF THE PREFERRED EMBODIMENTS

The present invention provides improved bore tubes for cylindrical magnet systems. The bore tubes of the present invention may be applied to the OVC, the thermal radiation shield or a cryogen vessel. With some modification, the principles of the present invention may also be applied to the structure of the gradient coil assembly.

The present invention exploits that fact that the resonant frequency of a bore tube is determined more by its mass per unit area than by the mass density of the material used, by increasing the mass per unit area but leaving other key properties: flexibility/elasticity and electrical conductivity unchanged.

In certain embodiments, a bore tube is constructed of a first, continuous electrically conducting, tube, with a secondary tube bonded onto the first tube. Preferably, the second tube has a mass per unit area which is significantly higher than that of the primary tube. The second tube is segmented in such a way that it has a much reduced overall elasticity compared to the same tube when not segmented.

The structure of the present invention provides a bore tube having a combination of properties which are difficult to achieve in a single material. In particular, a combination of high electrical conductivity, low resonant frequency, and flexibility for bore tubes; and the required electrical and physical properties, with adjusted resonant frequencies, for gradient coil assemblies.

The combined tube will have a mass per unit area much increased as compared to the mass per unit area of the first tube alone, yet will have elasticity similar to that of the first tube alone. By including a first continuous tube, the bore tube's function as part of a thermal or magnetic shield, cryogen container or vacuum vessel is not compromised.

The improved bore tube of the present invention will have resonant modes determined, among other things, by the cutting pattern of the segmenting of the second tube. The cutting pattern may be selected to give required resonant modes. Differing segmentation patterns may be applied to different parts of a bore tube according to the present invention. A much wider choice of resonant frequencies is provided by the bore tube of the present invention as compared to a bore tube formed of a continuous sheet of material.

Figure 1:
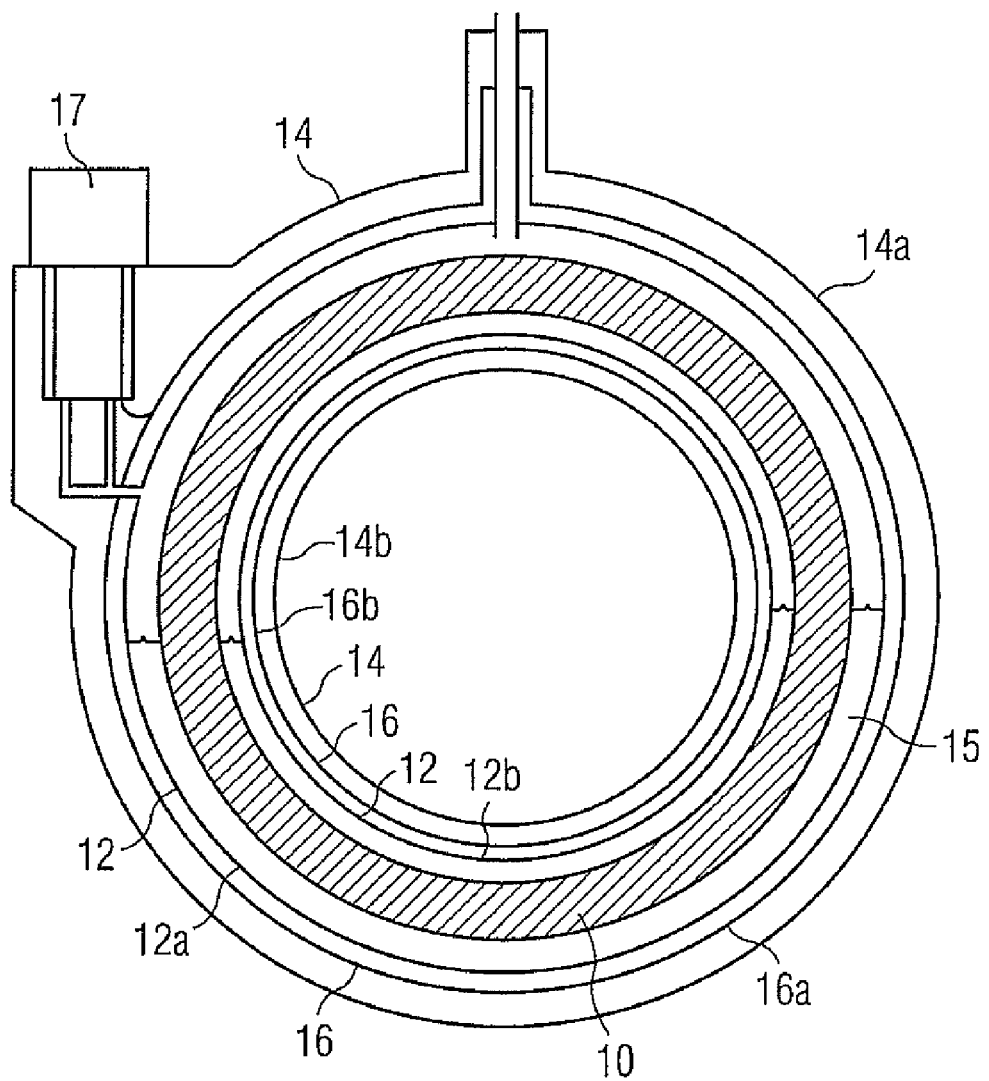
FIG. 1 shows a radial cross-section of a typical magnet system for use in an imaging system.

By applying appropriately segmented second tubes to the multiple bore tubes of the OVC, radiation shield and cryogen vessel, if any, of a superconducting magnet system as illustrated in FIG. 1, the resonant frequencies of the bore tubes may be separated. The resonant frequencies may be decoupled, with the result of less dissipation of heat to the cryogen vessel, thermal radiation shield or cooled magnet, and less acoustic noise for the patient. Assuming a gradient coil oscillation frequency of about 1500 Hz, the bore tubes should be tuned to have a resonant frequency of less than about 600 Hz, or more than about 2 KHz, to avoid resonant oscillation at the gradient coil frequency.

Figure 2:
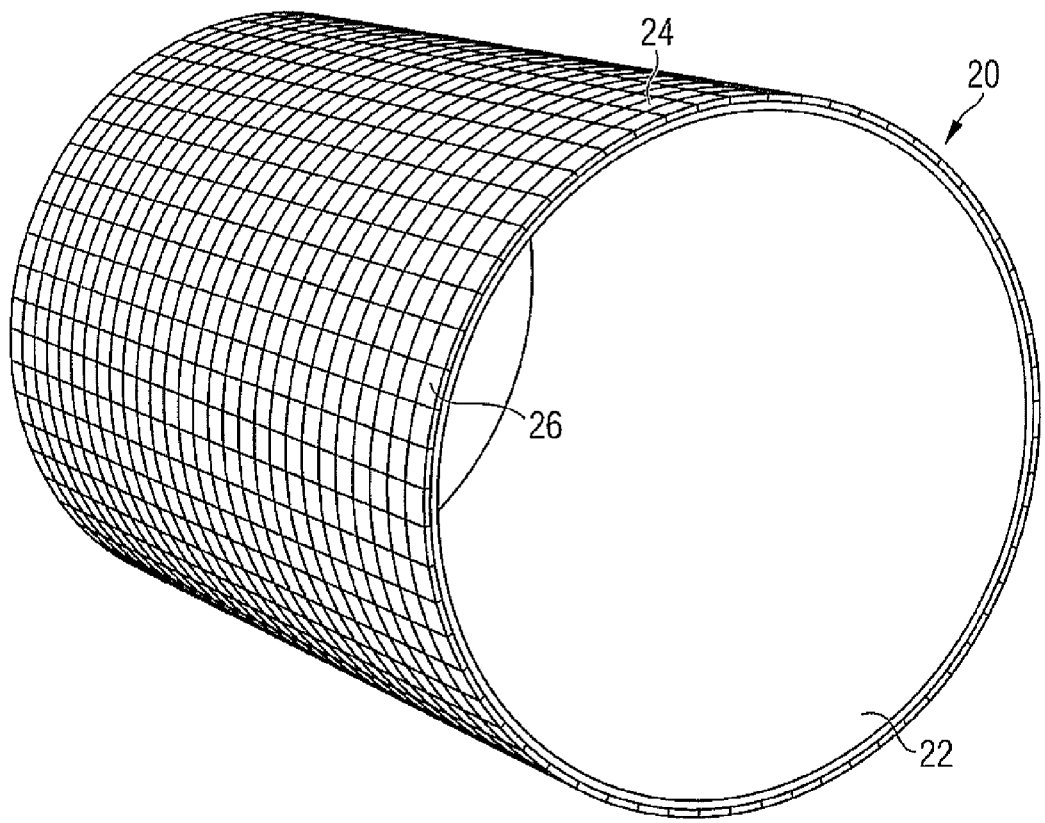
FIG. 2 shows an example bore tube of the present invention.

FIG. 2 shows an example bore tube 20 of the present invention, illustrating the general concept.

FIG. 2 shows a first tube 22, being a continuous tube of conductive material. To the radially outer surface of the first tube is attached a second tube 24, which is segmented into separate, substantially planar elements 26. The second tube need not be of an electrically conductive material, but should be of relatively high mass density.

In FIG. 2, the elements 26 are shown as being planar rectangles of equal sizes. However, the elements may be of any appropriate shape: triangle, square, hexagon, trapezium, or combination of shapes: octagons and squares; hexagons and triangles; differently-shaped triangles; squares and rectangles. Variation of the shapes of the elements may be used to provide regions of differing stiffness and resonant frequencies over the surface of the tube. The second tube 24 may be made stiffer in some regions to correspond to the pattern of forces induced by stray fields from the gradient coils.

Figure 3:
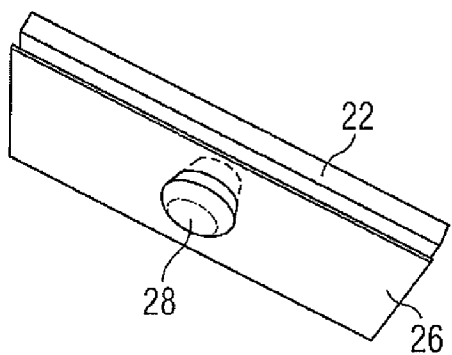
FIG. 3 shows an element attached to a first tube in an embodiment of the invention.

As illustrated in FIG. 3, each element 26 is attached to the first tube 22 by a fastener 28, preferably near the geometric center of the element. The contact area between the first tube 22 and the element 26 should be kept small, so that the elements do not contribute to the stiffness of the first tube. The fastener 28 should be selected accordingly. Preferably, countersunk rivets are used, so as not to further increase the radial thickness of the bore tube. Alternatively, spot welding, brazing, soldering or stapling may be used. The elements 26 may be attached by bolts or screws, if radial space permits, but such fasteners should be locked in position, for example with a tack-weld, to prevent any element becoming loose. A non-penetrating method, such as spot-welding, brazing or soldering, should preferably be used on bore tubes for OVCs and cryogen vessels, to avoid the risk of leaks caused by the fastener. The elements 26 need not be planar, but should also not touch the first tube 22 other than where mounted.

Riveting is preferred for the bore tube 16b of the thermal radiation shield 16. Aluminum rivets are preferably used. Aluminum is an inexpensive and familiar material. More importantly, aluminum has a high coefficient of thermal expansion. As the rivets cool with the thermal radiation shield, the rivets will tend to get tighter rather than looser.

In a preferred embodiment, the first tube 22 is of high conductivity aluminum, whose thickness is selected to be greater than the skin depth of electromagnetic oscillations at the at the operating frequencies of the gradient coil The second tube 24 may be of 3 mm thick stainless steel. The material and thickness chosen for the second tube can be selected to achieve a desired mass per unit area. The size of the segments may be used to adjust the resulting resonant frequency. Suitable materials for the first tube 22 are the aluminum alloy known as Al1200, and the copper alloy known as C101.

The elements 26 should be small in comparison to the dimensions of the bore tube as a whole, and relative to the wavelength of the highest expected frequency of oscillation of stray gradient field. For example, the greatest dimension of each element 26 may be less than one-quarter of the wavelength of the highest expected frequency in the material of the second tube 24. The wavelength is largely determined by the positions of the magnet coils and the gradient coils, but a maximum axial length of 50 mm is believed to be advisable. The elements should be spaced close to one another, to avoid oscillations in the material of the first tube.

In an example of such an arrangement, the first tube 22 is constructed of aluminum of 2 mm thickness, bonded to a second segmented tube 24 of stainless steel of 2 mm thickness. This will increase the effective mass per unit area of the first tube 22 by a factor of about four, but will not significantly change its stiffness. This combination will cause the resonant frequency of the first tube 22 to approximately halve, for example from 1300 Hz to 650 Hz. Assuming that the skin depth of the electromagnetic vibrations in the aluminum of the first tube is less than the thickness of the first tube, the Lorenz forces resulting from eddy currents flowing in the first tube, in the background magnetic field of the magnet 10, will result in a reduction of the amplitude of vibration by a factor of about four. This assumes that the resonant frequency of the bore tube of the invention is significantly lower than the applied frequency of oscillation of the gradient magnetic field.

In order to effectively reduce the resonant frequency of the bore tube, the second tube 24 should have a mass per unit area at least equal to the mass per unit area of the first tube 22.

The resultant bore tube 20, made up of an inner conductive first tube 22 and an outer segmented second tube 24, has the desirable combination of high electrical conductivity, provided by the first tube, with tunable, low mechanical resonance frequencies due to the high mass loading due to the segmented second tube.

Improvements to this basic embodiment may be made as follows. It has been found that elements 26 attached 28 only at a single point near their geometric center, such as shown in FIG. 3, have a tendency to rock on their fastener at low frequencies. In an improved embodiment of the present invention, the elements of the second tube are each attached to neighboring elements at their edges. The attachments are stiff enough to prevent, or significantly restrict, the rocking motion, yet flexible enough that the second tube is not too stiff for effective operation according to the invention. The attachments may be separate pieces, applied to join separate elements together, but preferably the elements and the attachments are all cut from a single tube of material.

Figure 4:
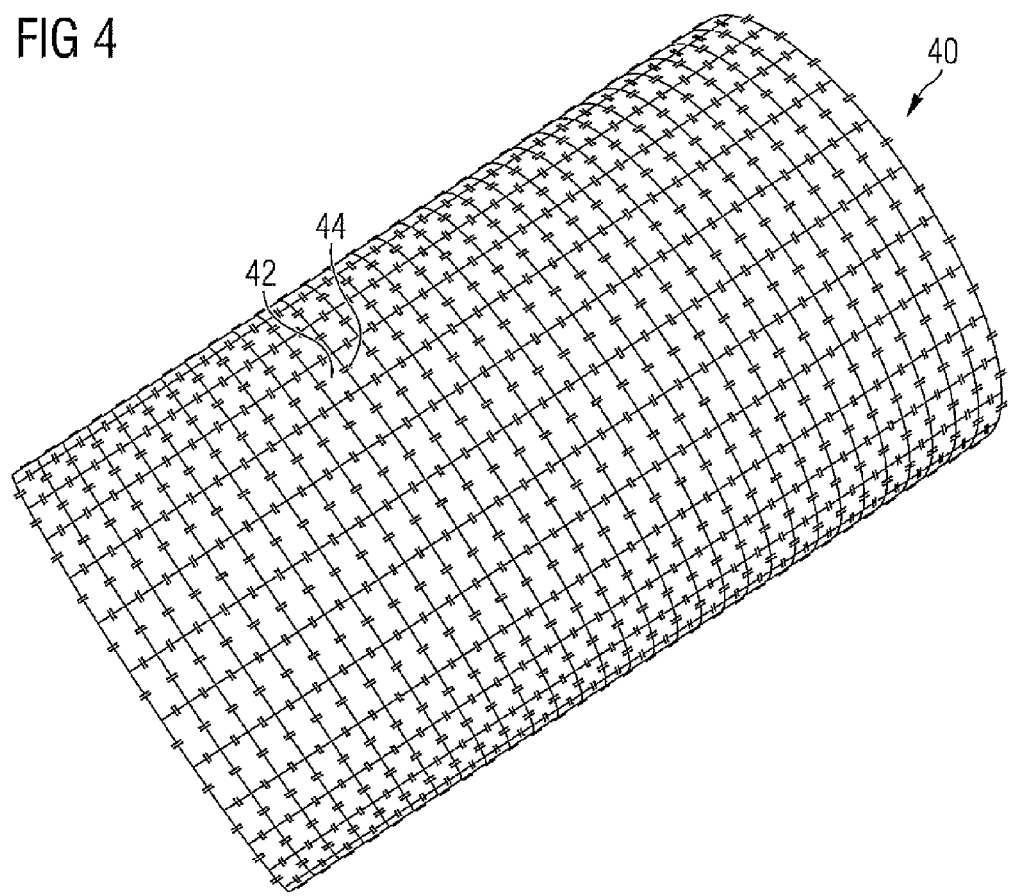
FIG. 4 shows a view of a second tube according to an embodiment of the invention.

FIG. 4 shows a view of a second tube 40 according to such an embodiment, where essentially rectangular segments 42 are joined, midway along each side to an adjacent segment, by a spring element 44.

Figure 5:
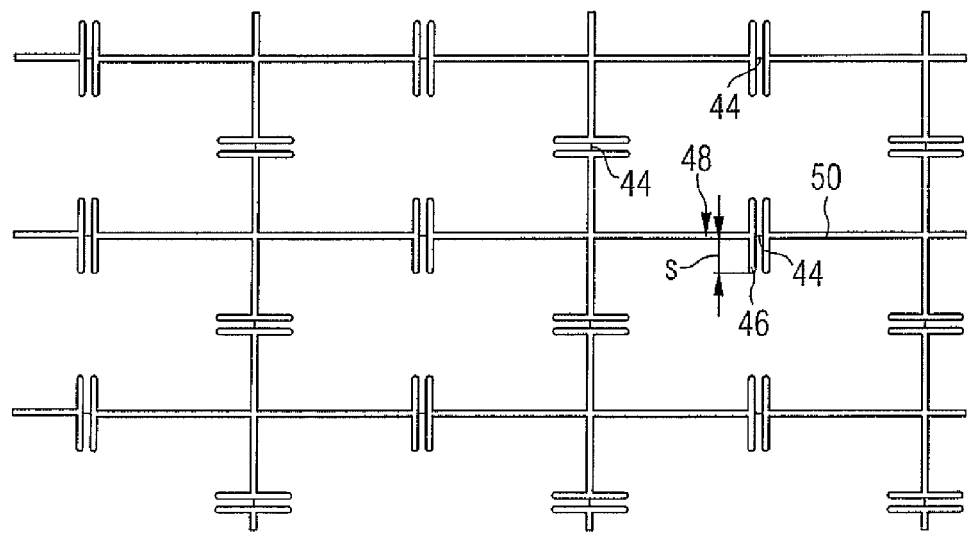
FIG. 5 shows an enlargement of part of the second tube shown in FIG. 4.

FIG. 5 shows an enlargement of part of the second tube 40 shown in FIG. 4. The elements 42 and spring elements 44 of this second tube are manufactured by cutting a continuous tube of an appropriate material. The essentially rectangular elements 42 are joined by spring elements 44 which each extend a certain distance s into the area of the rectangular element, being defined by cuts 46 which extend into the element, perpendicular to the associated side 48. The spring elements 44 here are essentially rods, and have a ratio of length to cross-sectional area much larger than that of the elements 42. The overall Young's modulus of the resulting second tube 40 is significantly less than that of the tube in its uncut state.

The tube is preferably cut using a method which does not deform the shape of the tube itself, and which produces an end results as shown in FIG. 4, which is still tubular, but divided into elements joined together at their edges. In alternative embodiments, the elements are joined together at their corners. Examples of suitable cutting methods include laser cutting, mechanical tools and water jet erosion. It is believed that the cuts 46, 50 do not need to be performed with great accuracy, and that a certain level of error may be beneficial in introducing variation in the sizes of the elements 42.

If, as discussed in the example embodiment, the first tube 22 is of aluminum and the second tube 40 is of stainless steel, stresses will build up between the first and second tubes when they are cooled. When cooled from a typical room temperature of 300K to a typical cryogenic thermal radiation shield temperature of 35K, aluminum will contract by about 0.35%, while stainless steel will contract by about 0.25%. The second tube 40 could be stretched while it is attached to the first tube, so that the stresses present at room temperature will cancel out at 35K. Alternatively, both the first tube 22 and the second tube 40 could be made of aluminum. However, in that case, the mass loading of the first tube 22 by the second 40 will be less, and the resultant shift in resonant frequency will be less than would be the case with a second tube 40 of stainless steel. Otherwise, the stresses in the second tube 40 will cause some stretching of the spring elements 44 between the elements 42, and a compression force acting on the first tube.

Figure 6:
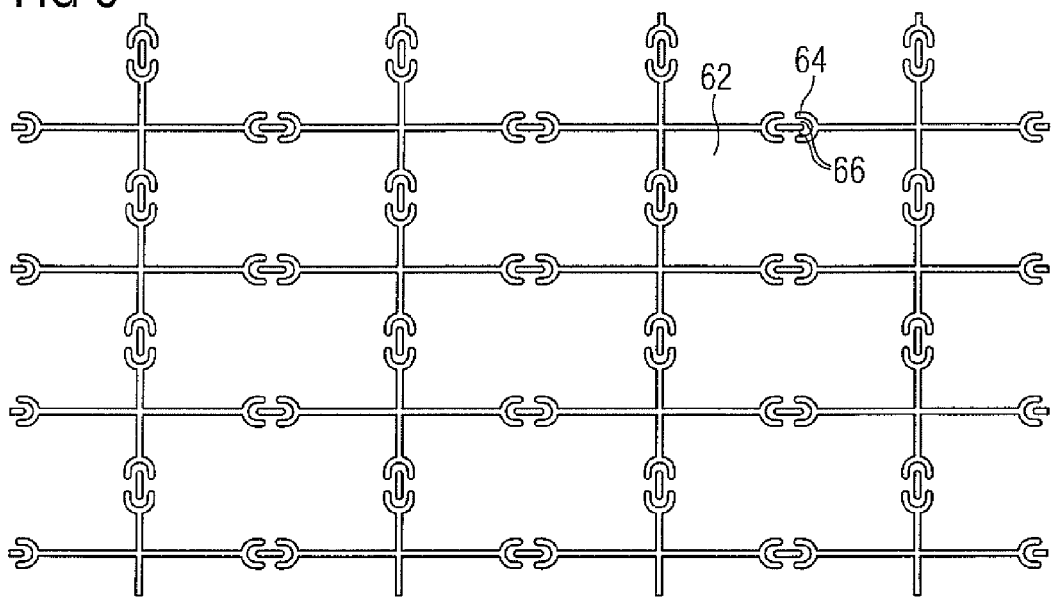
FIG. 6 shows an alternative cutting pattern for a second tube according to another embodiment of the invention.

FIG. 6 shows an alternative cutting pattern for a second tube 60 according to another embodiment of the invention. Again, the elements 62 and spring elements 64 are cut from a single tube of a suitable material. Here, the spring elements 64 are not as long as in the embodiment of FIG. 5. Each spring element comprises two bars 66, directed perpendicular to the length of the spring. The bars 66 are attached 68 to one another at each end, and each bar is attached 70, preferably at its midpoint, to an adjacent element 62. Stresses of tension or compression, for example due to differential expansion between first 22 and second 60 tubes, may be more readily be taken up by the springs of FIG. 6 than the springs of FIG. 5, as illustrated in FIGS. 7-8.

Figure 7:
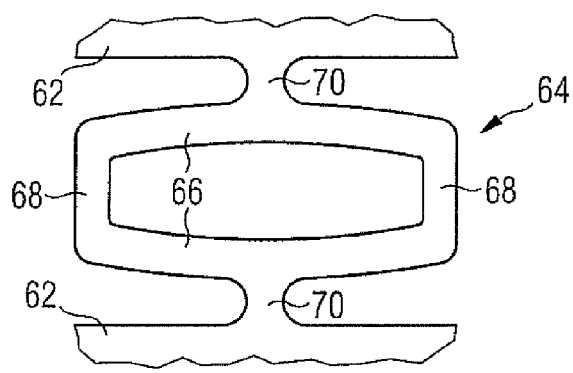
FIG. 7 shows a spring such as that illustrated in FIG. 6, when under tension.

FIG. 7 shows a spring element 64 such as that illustrated in FIG. 6, when under tension. The parts 68 attaching the bars 66 together and the parts 70 attaching each spring 64 to an adjacent element 62 may stretch to a certain extent, but most of the tension is taken up by flexing of the bars 66.

Figure 8:
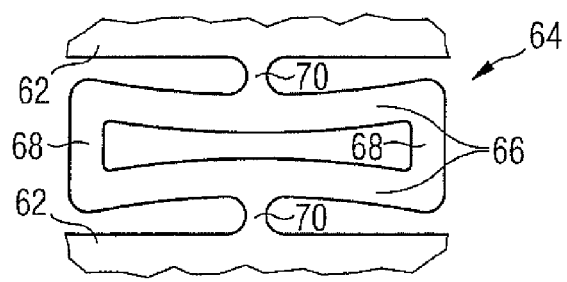
FIG. 8 similarly shows a spring such as that illustrated in FIG. 6, when under compression.

FIG. 8 similarly shows a spring element 64 such as that illustrated in FIG. 6, when under compression. The parts 68 attaching the bars together and the parts 70 attaching each spring 64 to an adjacent element 62 may compress to a certain extent, but most of the compression is taken up by flexing of the bars 66.

In an arrangement such as shown in FIG. 5, only the solid rods of the spring elements 44 can take up tension and compression, which is not as effective as the flexure provided by the spring elements of FIGS. 6-8.

In embodiments such as shown in FIGS. 5-8, where the elements and the spring elements are formed by cutting a single tube of material, several alternative manufacturing methods are possible, with slightly differing end products. Firstly, a tube of metal may be simply rolled and joined, and then cut. After cutting, the residual stresses in the material, introduced by rolling, will urge the separate elements to a more planar shape, with additional bending introduced in the circumferentially-directed springs.

Alternatively, the cutting may be done on a flat sheet of material, the flat sheet stacked between two others, and the stack of three layers rolled together, the outer sheets then being discarded or re-used. This will produce a network of elements and spring elements all of a constant radius.

Similarly, a solid tube may be rolled, and then annealed, for example by carefully controlled heating and cooling, to release residual stresses in the material before cutting takes place. This should also produce a network of elements and spring elements all of a constant radius.

The cutting may be carried out on a flat sheet of material which is then simply rolled into a tube. After rolling, the residual stresses will urge the separate elements to a more planar shape, with additional bending introduced in the circumferentially-directed spring elements. This method may lend itself to cutting by mechanical stamping, which is faster and less costly than laser cutting or water jet erosion.

The bore tube of the present invention will have resonance modes with resonance frequencies determined by the thickness, dimensions, shape and spacing of the elements of the second tube. The present invention provides a much wider range of attainable resonance frequencies than would be possible if the bore tube were a single continuous tube of material. The resonant frequencies of bore tubes may be selected such that coupling between concentric bore tubes is suppressed, leading to lower heat dissipation in the bore tubes or the material of the magnet due to stray magnetic fields from gradient coils than in known arrangements.

The present invention may alternatively be embodied in arrangements in which the second tube lies radially within the first tube. In such embodiments, the cuts between elements may be made rather wider, to prevent interference between adjacent elements. The elements should also be curved sufficiently that their edges do not foul the radially inner surface of the first tube.

The present invention may also be applied to the gradient coil assembly, to modify the modal resonant frequencies of the assembly and to reduce acoustic noise caused by vibration of the gradient coil assembly. As the elements of the second tube of the present invention preferably have a mass per unit area at least equal to, and preferably rather higher, than that of the first tube, the second tube used in conjunction with a gradient coil assembly must be rather more substantial than a second tube used on bore tubes as discussed above.

In certain embodiments, it may be sufficient to change the resonant frequency of one bore tube—for example the thermal radiation shield—away from the gradient coil frequency, leaving the others unchanged. For example, if the shield bore tube has a resonant frequency of 650 Hz, but the OVC bore tube has an unchanged resonant frequency of about 1300 Hz, the two bore tubes may have an effective resonant frequency intermediate between these two values, which may be sufficient to prevent troublesome mechanical oscillations with a gradient coil frequency of 1300-1500 Hz.

Although modifications and changes may be suggested by those skilled in the art, it is the intention of the inventor to embody within the patent warranted hereon all changes and modifications as reasonably and properly come within the scope of his contribution to the art.

I claim as my invention:

1. A bore tube for use in an imaging apparatus, comprising:
a first tube being a complete cylinder of electrically conductive material; and
separate elements covering most of a cylindrical surface of the first tube, each separate element being attached to the first tube by a fastener located near a geometric center of the respective element.

2. The bore tube according to claim 1 wherein the separate elements are substantially planar and are attached to a radially outer surface of the first tube.

3. The bore tube according to claim 1 wherein the separate elements are curved and are attached to a radially inner surface of the first tube.

4. The bore tube according to claim 1 wherein at least one of the fasteners comprises a rivet, staple, bolt or screw.

5. The bore tube according to claim 1 wherein at least one of the fasteners comprises a weld, solder or brazing.

6. The bore tube according to claim 1 wherein the separate elements each have a maximum axial dimension of 50 mm or less.

7. A method of constructing a bore tube for use in an imaging apparatus, comprising the steps of:
providing a first tube being a complete cylinder of electrically conductive material; and
providing separate elements and attaching each separate element to the first tube by a fastener located near a geometric center of the respective element so as to cover most of a cylindrical surface of the first tube.

8. The method according to claim 7 wherein at least one of the fasteners comprises a rivet, staple, bolt or screw.

9. The method according to claim 8 wherein at least one of the fasteners comprises a weld, soldering or brazing.

10. The method according to claim 7 wherein the separate elements are substantially planar and are attached to a radially outer surface of the first tube.

11. The method according to claim 7 wherein the separate elements are curved and are attached to a radially inner surface of the first tube.

12. A bore tube for use in an imaging apparatus, comprising:
a first tube; and
a second tube wherein
the first tube is a complete cylinder of electrically conductive material, and
the second tube is segmented into elements wherein the elements are attached together at adjacent edges or corners by spring elements, and each element is attached to the first tube.

13. The bore tube according to claim 12 wherein each element is attached to the first tube by a fastener located at a geometric center of the respective element.

14. The bore tube according to claim 12 wherein each element is attached to the first tube by a fastener, and at least one of the fasteners comprises a rivet, staple, bolt or screw.

15. The bore tube according to claim 12 wherein each element is attached to the first tube by a fastener, and at least one of the fasteners comprises a weld, solder or brazing.

16. The bore tube according to claim 12 wherein the spring elements each extend a certain distance into the area of the attached elements, being defined by cuts which extend into the elements perpendicular to each associated side of an element.

17. The bore tube according to claim 12 wherein the spring elements each comprise two bars directed perpendicular to a length of the spring element; the bars being attached to one another at each end, and each bar being attached to an adjacent element.

18. A method of constructing a bore tube for use in an imaging apparatus, comprising the steps of:
providing a first tube being a complete cylinder of electrically conductive material;

preparing a second tube segmented into elements by cutting the second tube to leave the elements of the second tube joined together at adjacent edges or corners by spring elements; and attaching each of the elements to the first tube.

19. The method according to claim 18 wherein the step of preparing the second tube comprises forming the elements and the spring elements in a single piece of material, the spring elements each extending a certain distance into an area of the attached elements and being defined by cuts which extend into the attached elements perpendicular to each associated side of the element.

20. The method according to claim 18 wherein the step of preparing the second tube comprises forming the elements and the spring elements in a single piece of material, the spring elements each comprising two bars directed perpendicular to a length of the spring element, the bars being attached to one another at each end, and each bar being attached to an adjacent element.

21. The method according to claim 18 wherein the step of attaching each of the elements to the first tube comprises attaching by a fastener, and the fastener comprises a rivet, staple, bolt or screw.

22. The method according to claim 18 wherein the step of attaching each of the elements to the first tube comprises attaching by welding, soldering or brazing.

* * * * *